(12) United States Patent
Maekawa et al.

(10) Patent No.: US 6,880,539 B2
(45) Date of Patent: Apr. 19, 2005

(54) IGNITION APPARATUS FOR AN INTERNAL COMBUSTION ENGINE AND A MANUFACTURING METHOD THEREFOR

(75) Inventors: Toshio Maekawa, Tokyo (JP); Takeshi Shimizu, Tokyo (JP); Mitsuru Koiwa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 143 days.

(21) Appl. No.: 10/303,710

(22) Filed: Nov. 26, 2002

(65) Prior Publication Data

US 2003/0230293 A1 Dec. 18, 2003

(30) Foreign Application Priority Data

Jun. 12, 2002 (JP) .......................................... 2002-171551

(51) Int. Cl.[7] ................................................. H01F 7/06
(52) U.S. Cl. ................... 123/634; 123/647; 123/143 C; 29/606
(58) Field of Search ................................. 123/634, 647, 123/143 C; 323/361, 346, 350, 351, 371; 29/606

(56) References Cited

U.S. PATENT DOCUMENTS 4,248,201 A * 2/1981 Tsutsui et al. ............... 123/647
5,662,091 A * 9/1997 Sawazaki et al. ........... 123/647
6,107,790 A * 8/2000 Sawazaki et al. ........... 323/371

FOREIGN PATENT DOCUMENTS

| JP | 4-5627 | 1/1992 |
| JP | 07-029751 | 1/1995 |
| JP | 07-139458 | 5/1995 |
| JP | 08-042438 | 2/1996 |
| JP | 2000-040628 | 2/2000 |
| JP | 07-029751 | 8/2000 |

* cited by examiner

Primary Examiner—Henry C. Yuen
Assistant Examiner—Arnold Castro
(74) Attorney, Agent, or Firm—Sughrue Mion, PLLC

(57) ABSTRACT

An ignition apparatus for an internal combustion engine can increase the degree of freedom of wiring paths of electroconductive wires as well as simplifying and miniaturizing a wiring module. Transformers (5A, 5B, 5C) are built into a casing (4) and each includes a core (6), a primary coil (8) and a secondary coil (10) arranged to surround the core for generating a high voltage in the secondary coil (10). A wiring module (20) built into the casing electrically connects the transformers and the switching module with one another. An insulating resin portion (11) fixedly attaches the transformers, the switching module and the wiring module to the casing. The wiring module (20) includes a module main body (22), which is formed by integrating a plurality of conductors (13, 14, 15) with one another through a resin, and flexible electroconductive wires (21) disposed along a surface of the module main body (22).

15 Claims, 9 Drawing Sheets

IGNITION APPARATUS FOR AN INTERNAL COMBUSTION ENGINE AND A MANUFACTURING METHOD THEREFOR

BACKGROUND OF THE INVENTION

1. Field of the Invention

The present invention relates to an ignition apparatus for an internal combustion engine which supplies a high voltage to a spark plug for each engine cylinder, and it also relates to a method of manufacturing the same.

2. Description of the Related Art

FIG. 8 is a plan view of a known ignition apparatus 1 for an internal combustion engine shown in Japanese Patent Application Laid-Open No. Hei 7-29751. FIG. 9 is a cross sectional view of the ignition apparatus 1 for an internal combustion engine taken along line XIV—XIV in FIG. 8. FIG. 10 is an electric circuit diagram of the ignition apparatus 1 for an internal combustion engine shown in FIG. 8.

The ignition apparatus 1 illustrated is used by a simultaneous ignition system for an internal combustion engine, that is, the opposite ends of a secondary coil 6 of each transformer are finally connected to two spark plugs. The ignition apparatus 1 is provided with three transformers 5A, 5B, 5C, and is used for an internal combustion engine having six cylinders.

The first through third transformers 5A, 5B, 5C of the ignition apparatus 1 are built into a casing 4 that is molded with a resin and has a plurality of high-voltage towers 3 formed at its head. Each of the first through third transformers 5A, 5B, 5C includes a closed magnetic circuit core 6 which forms a hollow-rectangular-shaped closed magnetic circuit, a primary coil 8 which has a conducting wire wound around a primary bobbin 7 surrounding the closed magnetic circuit core 6, and a secondary coil 10 which has a conducting wire wound around a secondary bobbin 9 surrounding the primary coil 8. In addition, a switching module 12, which is a circuit unit for controlling the energization of the primary coils 8, is built into the casing 4.

The conducting wire of each primary coil 8 is finally connected at its one end through a first conductor 13 to a power supply (not shown) such as the battery of a vehicle. The conducting wire of each primary coil 8 is also connected at its other end through a second conductor 14 with a terminal of a corresponding switching module 12, e.g., a collector of a corresponding power transistor which constitute the switching module 12. Moreover, a third conductor 15 in the form of a power supply ground wire and fourth conductors 16 in the form of signal lines connected with a control unit (not shown) are respectively connected with the switching module 12.

Also, the conducting wire of each secondary coil 10 is connected at its opposite ends with the corresponding high-voltage tower terminals 17 in the high-voltage towers 3, respectively. The high-voltage tower terminals 17 are electrically connected with spark plugs (not shown) through high-tension cords (not shown).

The first conductor 13, the second conductor 14, the third conductor 15 and the fourth conductors 16 are integrally formed with one another through a resin to provide a wiring module 18.

The wiring module 18, the switching module 12, and the first through third transformers 5A, 5B, 5C are fixedly attached to the inner surface of the casing 4 through an insulating resin portion 11 made of a thermosetting resin such as an epoxy resin.

Now, the operation of the ignition apparatus 1 for an internal combustion engine as constructed above will be explained below.

The switching module 12 is driven by control signals from the control unit of the internal combustion engine, so that a primary current flowing through each primary coil 8 is controlled to be supplied and interrupted in an appropriate manner by the switching module 12.

When the primary current to the primary coils 8 is interrupted or cut off at prescribed ignition timing of the internal combustion engine, counterelectromotive forces are generated in the primary coils 8 whereby a high voltage is produced in the secondary coils 10 of the transformers 5A, 5B, 5C. As a result, the high voltage thus produced is impressed on the spark plugs (not shown) connected with the secondary coils 10, whereby air fuel mixtures in the unillustrated engine cylinders are dielectrically broken down, and fired by sparking of the corresponding spark plugs caused by discharging of secondary current flowing through the respective secondary coils 10.

With the known ignition apparatus for an internal combustion engine, the wiring module 18 is formed by integrating the first conductor 13, the second conductor 14, the third conductor 15 and the fourth conductors 16 with one another through a resin. However, as the number of the transformers 5A, 5B, 5C increases, it is necessary to accordingly increase the number of the conductors 13 through 16, thus making the wiring paths of the respective conductors 13 through 16 further complicated as well as enlarging the size of the wiring module 18 itself.

In addition, if the number of the transformers is increased so much, it sometimes becomes impossible to arrange the wiring module in one and the same plane, and it is required to construct the wiring module by means of a plurality of stacked or laminated wiring module components.

Thus, the wiring module 18, which is formed by integrating all the conductors including the first conductor 13, the second conductor 14, the third conductor 15 and the fourth conductors 16 with one another through a resin as described above, gives rise to the following problem. That is, the degree of freedom of the wiring paths of the wiring module 18 is low, and hence if the size of the wiring module 18 is accordingly increased, or if the number of module components of the wiring module 18 is accordingly increased, the size of casing 4 receiving therein the wiring module 18 would have to be increased, thus making it difficult to install the ignition apparatus 1 for an internal combustion engine in the limited engine room of a vehicle.

SUMMARY OF THE INVENTION

The present invention is intended to obviate the problem as referred to above, and has for its object to provide an ignition apparatus for an internal combustion engine which is capable of increasing the degree of freedom of wiring paths of a wiring module as well as simplifying and miniaturizing the wiring module.

Another object of the present invention is to provide a method for manufacturing an ignition apparatus for an internal combustion engine in which electroconductive wires can be assembled into a main body of a wiring module with ease.

Bearing the above objects in mind, in one aspect, the present invention resides in an ignition apparatus for an internal combustion engine which includes: a casing; a transformer built in the casing and having a core, a primary coil and a secondary coil arranged to surround the core such that a high voltage for ignition is generated in the secondary coil; a circuit unit including electronic parts built into the casing; a wiring module that electrically connects the transformer and the circuit unit with each other; and an insulating resin part that fixedly attaches the transformer, the circuit unit and the wiring module to the casing. The wiring module includes a module main body having a plurality of conductors integrated with one another through a resin, and flexible electroconductive wires disposed along a surface of the module main body. With such an arrangement, it is possible to increase the degree of freedom of the wiring paths of the electroconductive wires, simplify and miniaturize the wiring module. Consequently, the wiring module can be easily installed in the limited engine room of a vehicle. In addition, the thermal stresses imparted to the electroconductive wires, which are generated by a difference in the thermal expansion coefficients between the insulating resin portion and the electroconductive wires under thermal shock, are reduced by the module main body.

In another aspect, the present invention resides in a method for manufacturing of an ignition apparatus for an internal combustion engine, the method including: disposing a flexible electroconductive wire element along a surface of a module main body; and thereafter cutting the electroconductive wire element to form a plurality of electroconductive wires. According to this method, it is possible to improve the operation of assembling the electroconductive wires to the module main body.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Hereinafter, preferred embodiments of the present invention will be described in detail while referring to the accompanying drawings, with the same or corresponding parts or members thereof as the above-mentioned known ones being identified by the same symbols.

Embodiment 1

Figure 1:
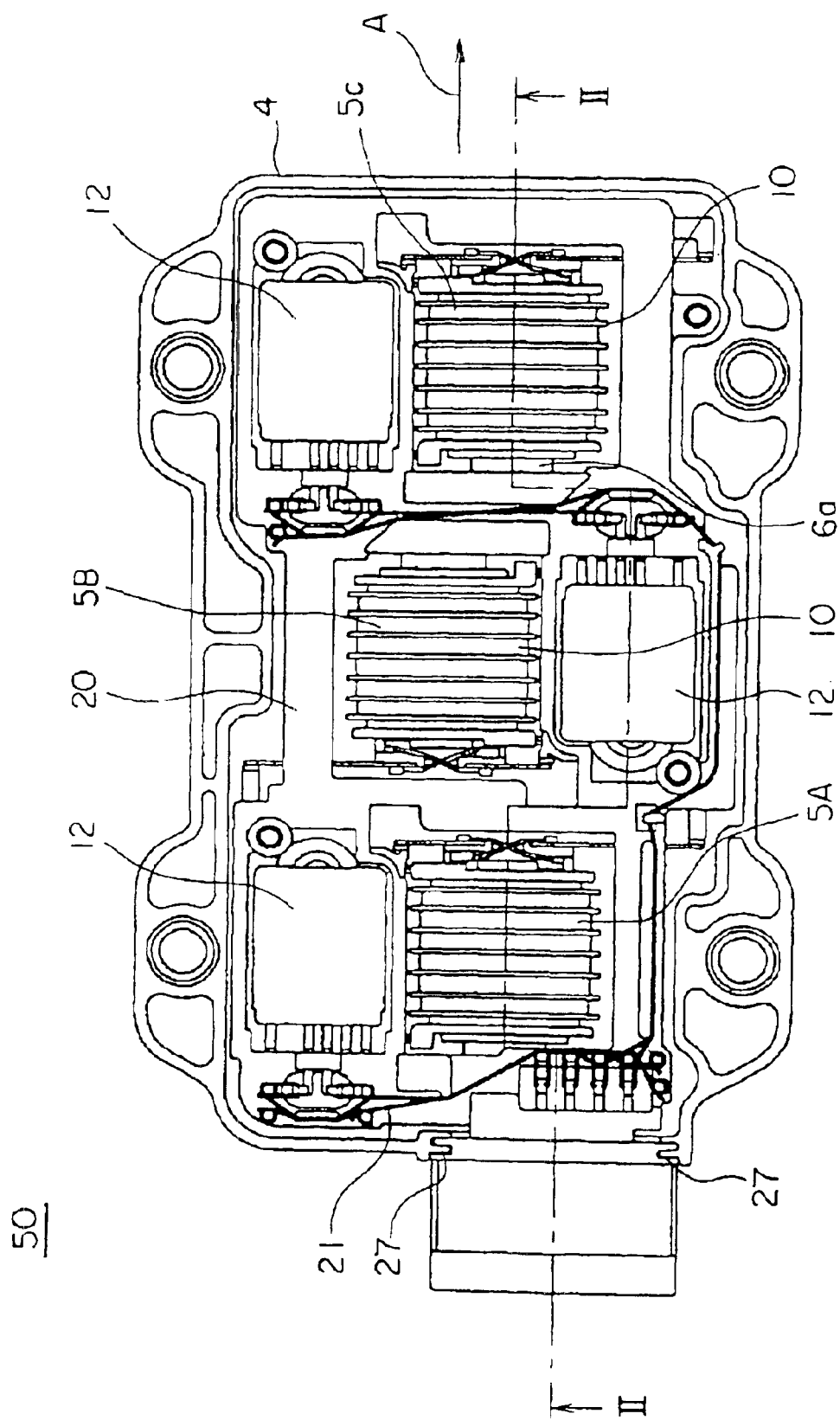
FIG. 1 is a view showing an ignition apparatus for an internal combustion engine according to a first embodiment of the present invention when seen from an opening side of a casing, with a casting resin being omitted.
Figure 2:
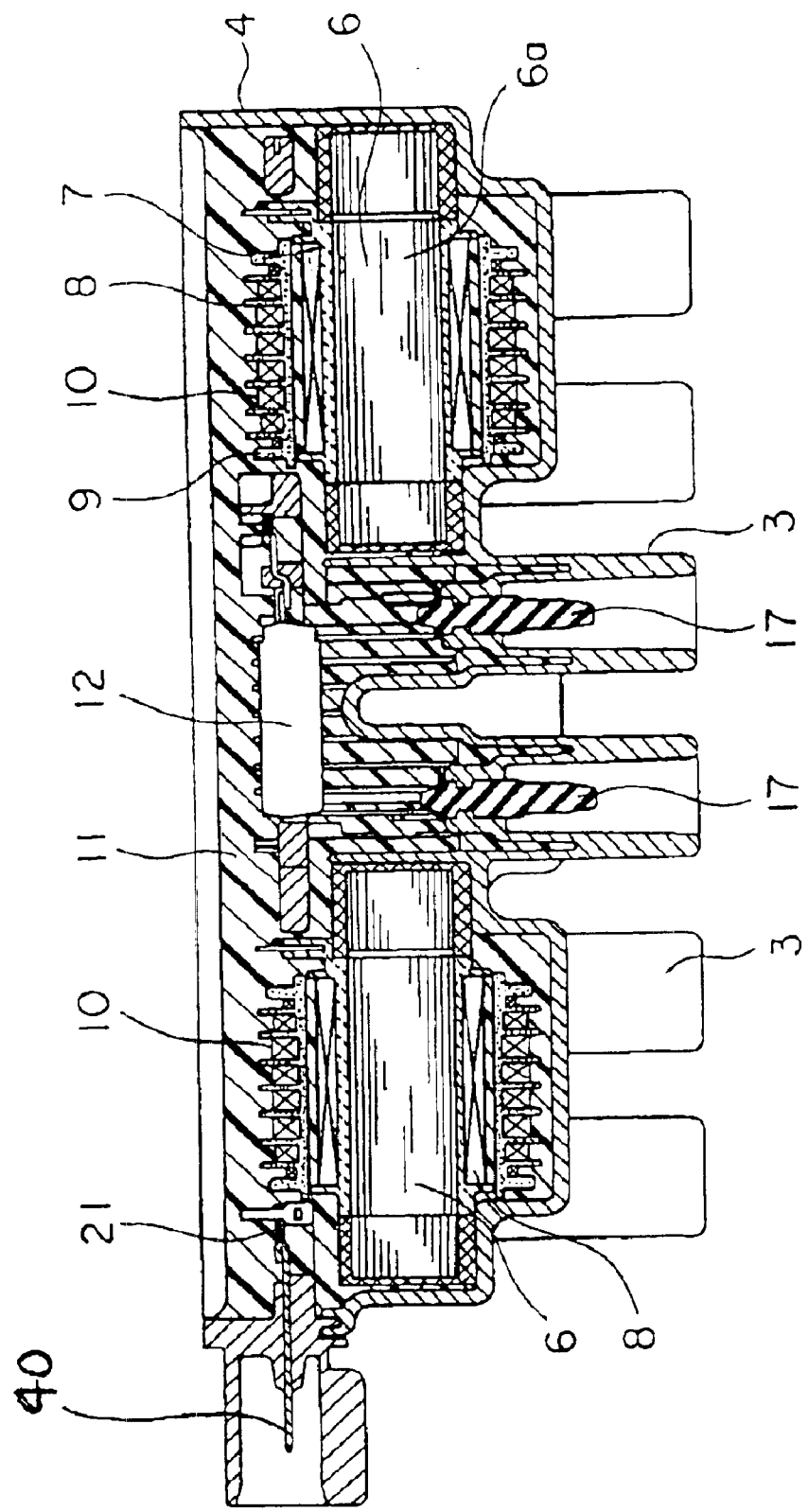
FIG. 2 is a cross sectional view taken along line II—II of FIG. 1.
Figure 3:
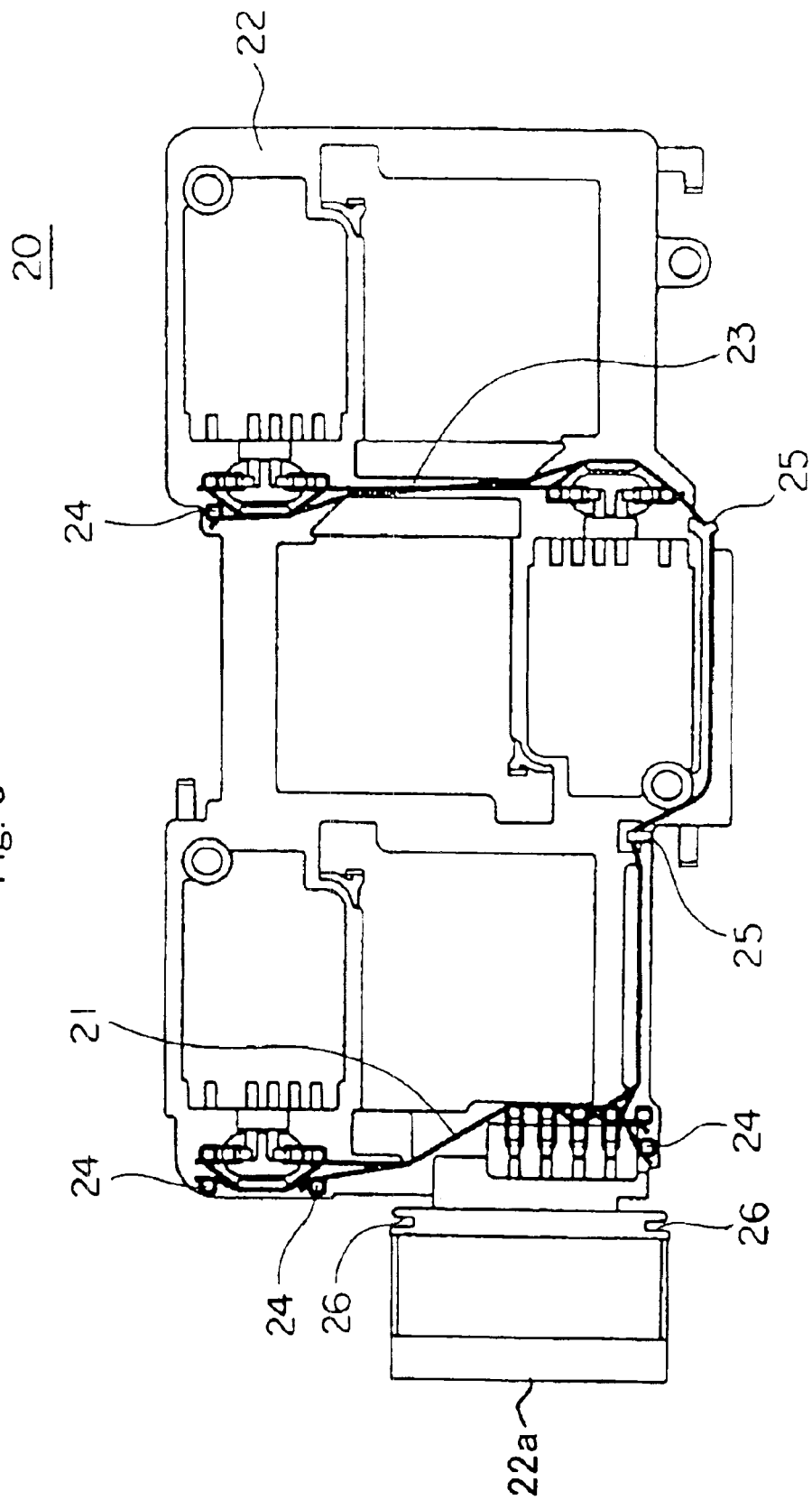
FIG. 3 is a plan view of a wiring module shown in FIG. 1.

FIG. 1 is a view of an ignition apparatus 50 for an internal combustion engine according to a first embodiment of the present invention, when seen from an opening side of a casing 4, with an insulating resin portion 11 being omitted. FIG. 2 is a cross sectional view taken along line II—II of FIG. 1. FIG. 3 is a plan view of a wiring module 20 shown in FIG. 1.

In this ignition apparatus 50 for an internal combustion engine, the conducting wire of each secondary coil 10 is finally connected electrically at its opposite ends with two spark plugs (not shown), and the ignition apparatus 50 with three transformers 5A, 5B, 5C is used for an internal combustion engine having six cylinders.

The first through third transformers 5A, 5B, 5C of the ignition apparatus 50 are built into the casing 4 that is molded with a resin and has a plurality of high-voltage towers 3 formed at its head. Each of the first through third transformers 5A, 5B, 5C includes a closed magnetic circuit core 6 having an excitation portion 6a, a primary coil 8 with a conducting wire wound around a primary bobbin 7 surrounding the excitation portion 6a of the closed magnetic circuit core 6, and a secondary coil 10 with a conducting wire wound around a secondary bobbin 9 surrounding the primary coil 8.

In addition, a switching module 12, which is a circuit unit for controlling the energization of the primary coils 8, is built into the casing 4.

Also, the conducting wire of each secondary coil 10 is connected at its opposite ends with the corresponding high-voltage tower terminals 17 in the high-voltage towers 3. The high-voltage tower terminals 17 are electrically connected with spark plugs (not shown) through high-tension cords (not shown), respectively.

The respective closed magnetic circuit cores 6 of the first through third transformers 5A, 5B, 5C incorporated in the casing 4 are arranged along an axial direction A of the primary coils 8 and the secondary coils 10 in such a manner that the planes of the respective closed magnetic circuit cores 6 are disposed flush with one another and in parallel with the bottom surface of the casing 4. In addition, the primary coils 8 and the secondary coils 10 arranged around the excitation portions 6a of the mutually adjacent closed magnetic circuit cores 6 are provided on the excitation portions 6a which are mutually different sides in a zigzag form along the above-mentioned axial direction A.

Figure 10:
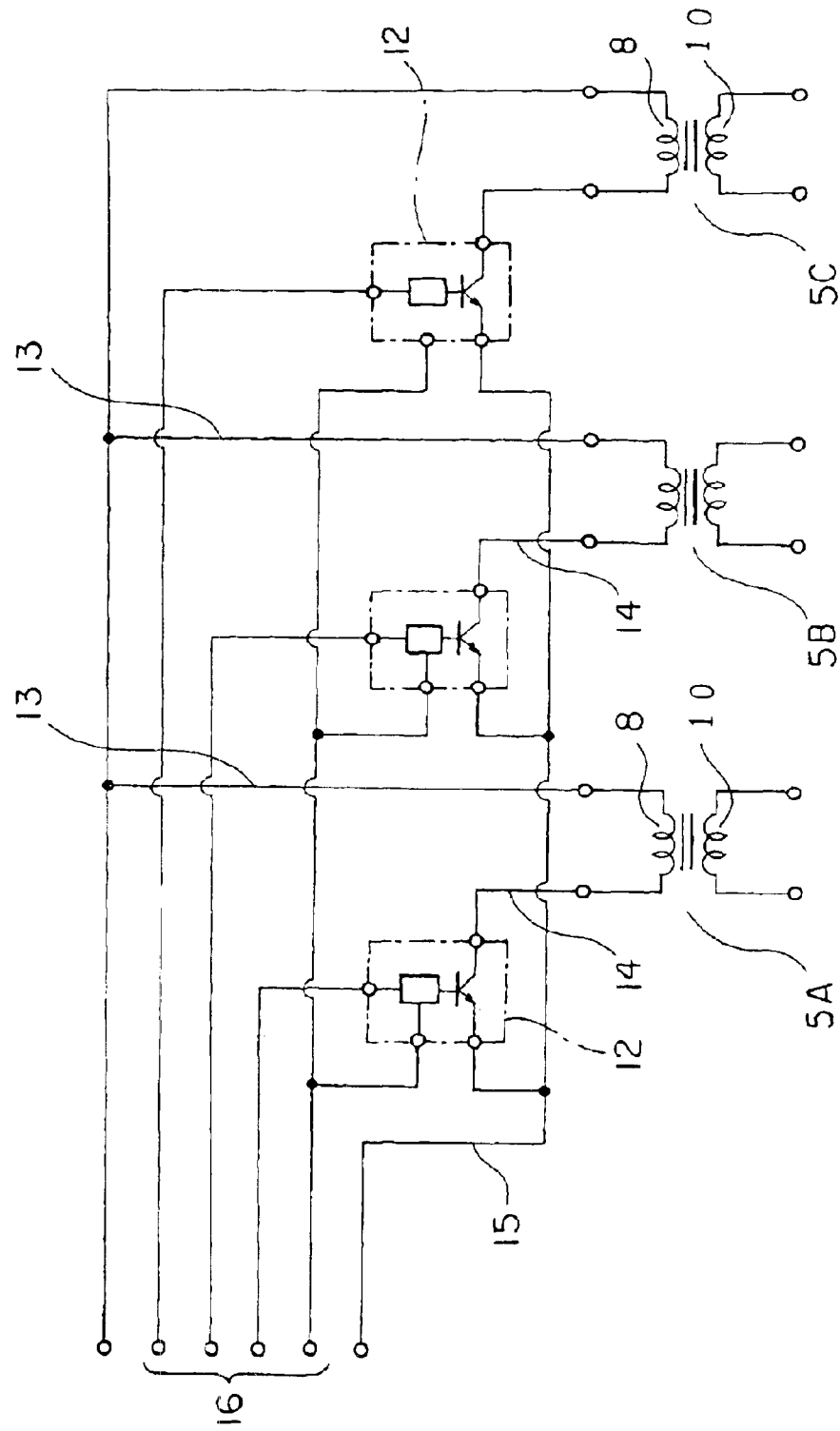
FIG. 10 is an electric circuit diagram of the ignition apparatus for an internal combustion engine shown in FIG. 8.

The conducting wire of each primary coil 8 is finally connected at its one end through a first conductor 13 (see FIG. 10) to a power supply (not shown) such as the battery of a vehicle. Also, the conducting wire of each primary coil 8 is finally connected at its other end through a second conductor 14 (see FIG. 10) with a terminal of a corresponding switching module 12, e.g., a collector of a corresponding power transistor which constitute the switching module 12. Further, connected with the switching module 12 are a third conductor 15 (see FIG. 10), which is a power supply ground wire, and a plurality of flexible electroconductive wires 21, which are in turn connected with a control unit (not shown) that sends control signals to the switching module 12.

Figure 4:
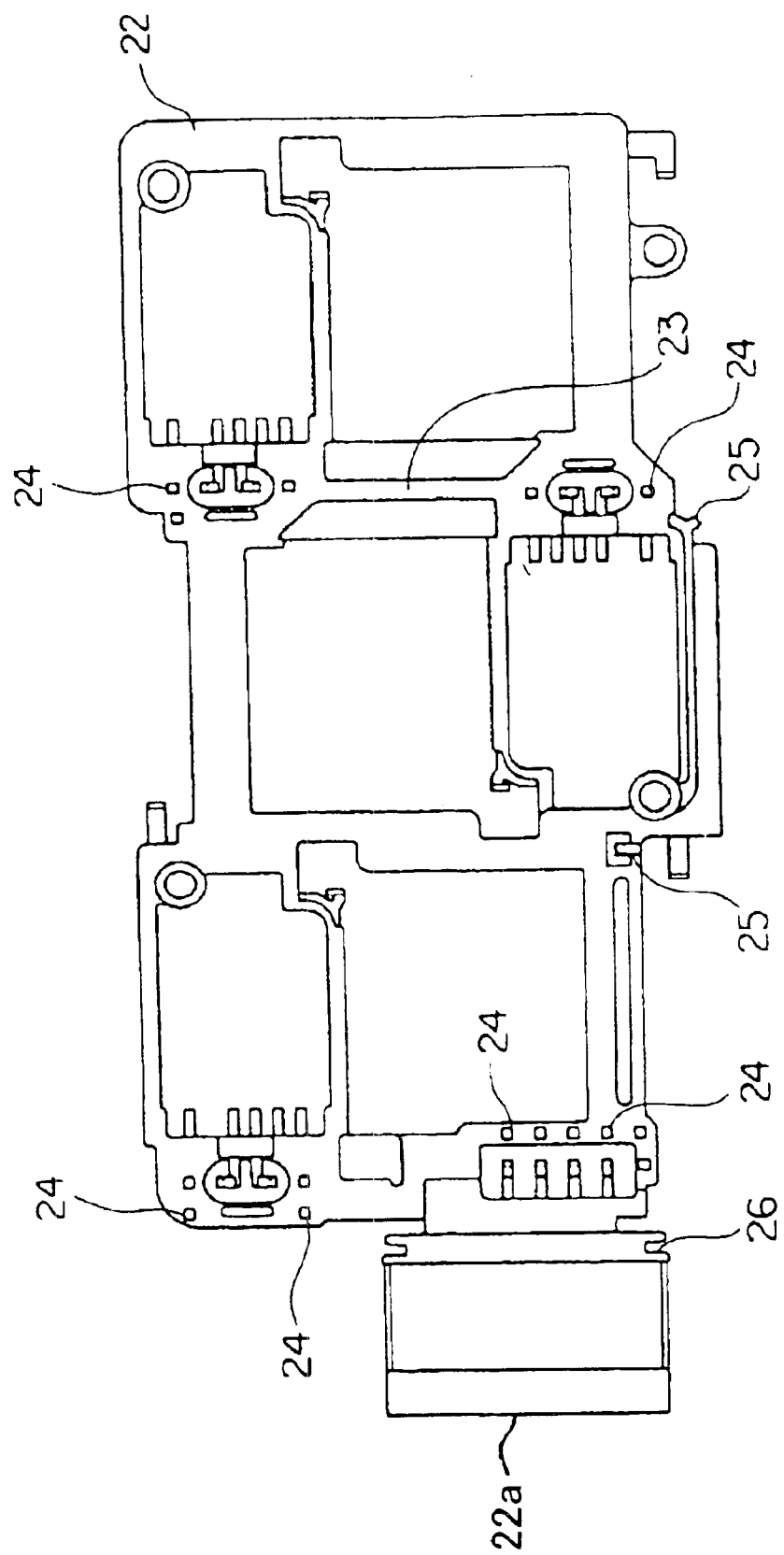
FIG. 4 is a plan view of a main body of the wiring module of FIG. 3.

The first conductor 13, the second conductor 14 and the third conductor 15 (see FIG. 10) are integrally molded with a resin to form a module main body or module proper 22 of the wiring module 20, as shown in FIG. 4. The flexible electroconductive wires 21 are arranged along a surface of the module main body 22. The electroconductive wires 21 are made of the same material, such as copper or other electroconductive materials, as that of the primary coils 8, and has its outer surface coated with an insulation film such as an enamel coating. The electroconductive wires 21 and the module main body 22 together constitute the wiring module 20.

The electroconductive wires 21 are connected at their one ends with the switching module 12 and at their other ends by fusing with corresponding hook-shaped ends, respectively, of a connector metal terminal 40.

The module main body 22 is formed with a restricting portion 23 comprising a pair of opposed wall portions for restricting therebetween the wiring paths of the electroconductive wires 21.

Figure 5:
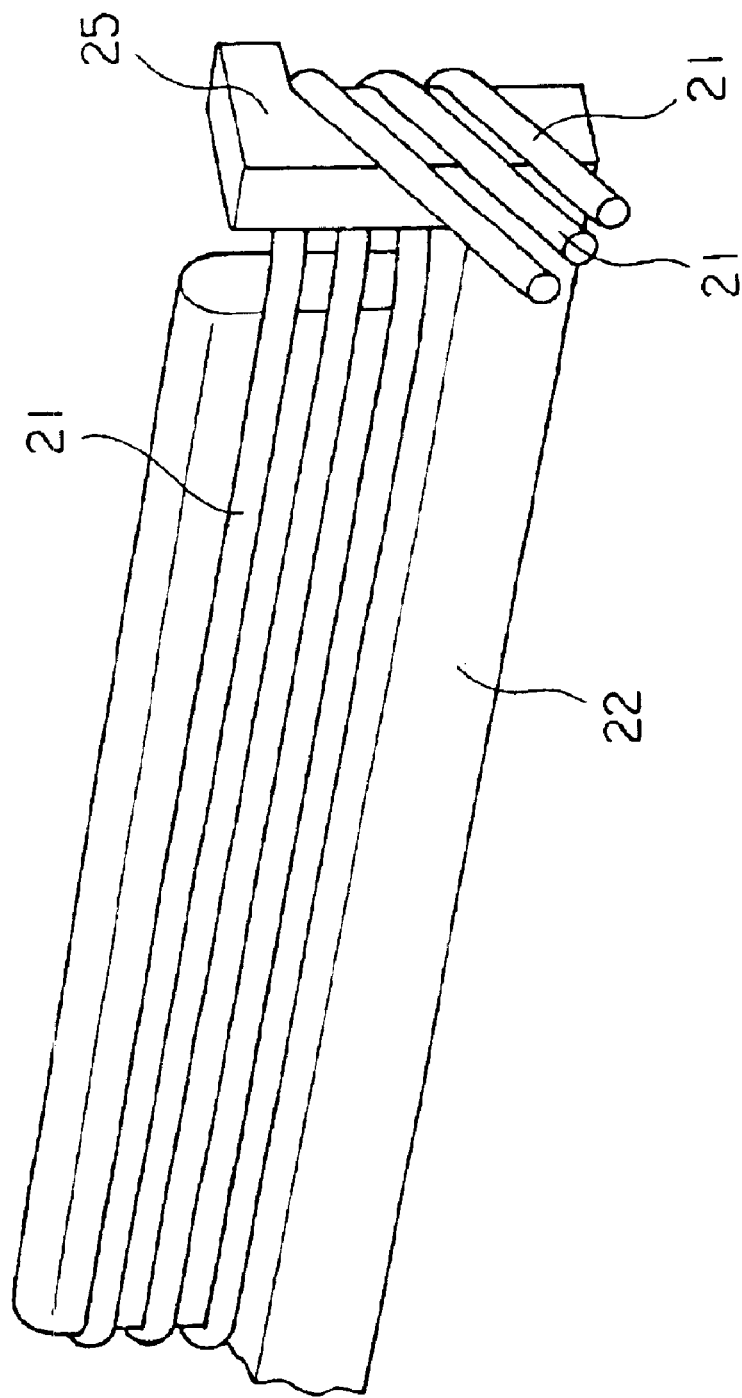
FIG. 5 is a plan view of the wiring module shown in FIG. 3.

When the module main body 22 is viewed from a direction perpendicular to a main or principal surface thereof, those portions of the wiring paths of the electroconductive wires 21 which are overlapped or superposed each other in the vertical direction are arranged apart from each other in a horizontal direction, as shown in FIG. 5.

The module main body 22 is also provided with a plurality of temporal tacking portions 24 which are formed of small circular projections for temporarily tacking the electroconductive wires 21.

The module main body 22 is further formed with a plurality of L-shaped engagement ribs 25 for engaging the electroconductive wires 21.

The wiring module 20 is arranged over the transformers 5A, 5B and 5C in such a manner that it is not superposed on the secondary coils 10. The wiring module 20 together with the first through third transformers 5A, 5B, 5C and the switching module 12 in the casing 4 is fixedly attached to the casing 4 through the insulating resin portion 11 made of a thermosetting resin such as an epoxy resin.

Further, the module main body 22 is formed with a connector housing 22a for electrical connection with external equipment of the ignition apparatus 50. The conductor housing 22a is formed at its base with a pair of opposed concave portions 26 which are adapted to be engaged with a pair of opposed convex portions 27 formed on the casing 4.

Now, the procedure of manufacturing the ignition apparatus 50 for an internal combustion engine as constructed above will be described below.

First, the transformers 5A, 5B, 5C and the switching module 12 are arranged in the casing 4. Then, the convex portions 27 of the casing 4 are fitted into the concave portions 26 in the conductor housing 22a of the wiring module 20, and the respective ends of the first conductor 13, the second conductor 14 and the third conductor 15 of the module main body 22 are electrically connected with the switching module 12 and the transformers 5A, 5B, 5C. The electroconductive wires 21 are connected at their one ends with the switching module 12 and at their other ends with the hook-shaped ends, respectively, of the connector metal terminal 40 by means of fusing.

Thereafter, a thermosetting resin such as, for example, an epoxy resin is filled into the casing 4 under a vacuum atmosphere, and solidified or cured at a high temperature to form the insulating resin portion 11. As a result, the transformers 5A, 5B, 5C, the switching module 12 and the wiring module 20 are fixed to one another and to the casing 4, and electrically insulated from high voltages.

With the ignition apparatus 50 for an internal combustion engine as constructed above, the respective closed magnetic circuit cores 6 are arranged along the axial direction A of the primary coils 8 and the secondary coils 10 in such a manner that the planes of the respective closed magnetic circuit cores 6 are disposed flush with one another and in parallel with the bottom surface of the casing 4. Consequently, the miniaturization and cost reduction of the entire apparatus can be achieved by shortening the overall height of the casing 4.

In addition, the wiring module 20 is arranged in an area in which it is not superposed on the transformers 5A, 5B, 5C, so that the use of an empty space serves for effective utilization of the space as well as reduction in the overall size and manufacturing cost of the ignition apparatus.

Moreover, the wiring module 20 is comprised of the module main body 22, which is formed by integrating the plurality of conductors 13, 14, 15 with one another through a resin, and the flexible electroconductive wires 21 disposed along the surface of the module main body 22, with the plurality of conductors 13, 14, 15 being arranged on one and the same plane. With such a construction and arrangement, the degree of freedom of the wiring paths of the electroconductive wires 21 increases, and the wiring module 20 can be simplified and reduced in size. As a result, it becomes possible to easily install the wiring module 20 in the limited engine room of a vehicle.

Since the electroconductive wires 21 are arranged along the module main body 22, the thermal stresses imparted to the electroconductive wires 21, which are generated by a difference in the thermal expansion coefficients between the insulating resin portion 11 and the electroconductive wires 21 under thermal shock, are reduced by the module main body 22.

Further, since each of the electroconductive wires 21 in the form of copper wires is formed on its outer surface with an enamel coating which is excellent in heat resistance and electric insulation, the electrical insulation of the electroconductive wires 21 can be ensured even if the electroconductive wires 21 are in contact with each other. Thus, it is possible to arrange the electroconductive wires 21 in such a manner that some portions thereof are superposed or overlapped each other, thereby making it possible to reduce the size of the wiring module 20. Also, the electroconductive wires 21 are excellent in flexibility, and hence the assembling operation of the electroconductive wires 21 on the module main body 22 can be carried out in an easy and simple manner. In addition, the electroconductive wires 21 also has good adhesion to the epoxy resin from which the insulating resin portion 11 is made.

Incidentally, note that ignition signals supplied to the switching module 12 from the control unit of the internal combustion engine are limited or minute as compared with the primary current flowing through each primary coil 8, and hence the cross sectional area of each of the conductors or electroconductive wires 21 carrying the ignition signals can be accordingly decreased. In order to insert mold the conductors or electroconductive wires 21 into the wiring module 20 with a resin, however, it is necessary to prevent deformation of the conductors due to the pressure of the resin caused upon such molding, and hence there is a limit to the reduction of the cross sectional area of the conductors.

On the other hand, in this embodiment, since the module main body 22, which is formed by insert molding, and the electroconductive wires 21, through which minute current flows, are formed separately from each other. As a consequence, there will be no deformation of the electroconductive wires 21 due to the resin pressure upon molding.

Furthermore, the electroconductive wires 21 and the hook-shaped ends of the connector metal terminal 40 are connected with each other by fusing, so that the enamel coatings of the electroconductive wires 21 can be burnt out and removed upon fusing without the need of being removed beforehand. As a result, the time for connecting operation can be shortened, and the electroconductive wires 21 and the connector metal terminal 40 can be connected with each other in a reliable manner.

In addition, the module main body 22 is formed with a restricting portion 23 in the form of a pair of opposed wall portions for restricting therebetween the wiring paths of the electroconductive wires 21, and hence the electroconductive wires 21 are prevented from extending from the outer periphery of the module main body 22. Therefore, there is no fear that when the wiring module 20 is arranged in the casing 4, the electroconductive wires 21 might interfere with the transformers 5A, 5B, 5C previously placed in the casing 4, thus making it possible to prevent deformation, breaks, etc., of the electroconductive wires 21 during manufacturing.

Moreover, when the module main body 22 is viewed from a direction perpendicular to the principal surface thereof, those portions of the wiring paths of the electroconductive wires 21 which are overlapped or superposed each other in one direction are arranged apart from each other in another direction. With such an arrangement, it is possible to ensure insulation between mutually contacted portions, if any, of the electroconductive wires 21, to prevent the electroconductive wires 21 from lying off the the outer periphery of the module main body 22, and to miniaturize the wiring module 20.

Further, the module main body 22 is provided with a plurality of temporal tacking portions 24 for temporarily tacking the electroconductive wires 21, so that the electroconductive wires 21 when arranged on the module main body 22 are temporarily tacked to the temporal tacking portions 24, thereby making the connecting operation of the electroconductive wires 21 easy and improving the reliability of the connections thereof.

As the wiring module 20 is assembled to the casing 4 by fitting the convex portions 27 of the casing 4 into the concave portions 26 in the wiring module 20, the module main body 22 might be caused to deform temporarily at that time to slack the electroconductive wires 21, as a result of which the electroconductive wires 21 might come off from the module main body 22. In this case, however, the module main body 22 is formed with the L-shaped engagement ribs 25 for engaging the electroconductive wires 21, whereby the electroconductive wires 21 are prevented from coming off from the module main body 22, thus improving the assembling operation.

Embodiment 2

Figure 6:
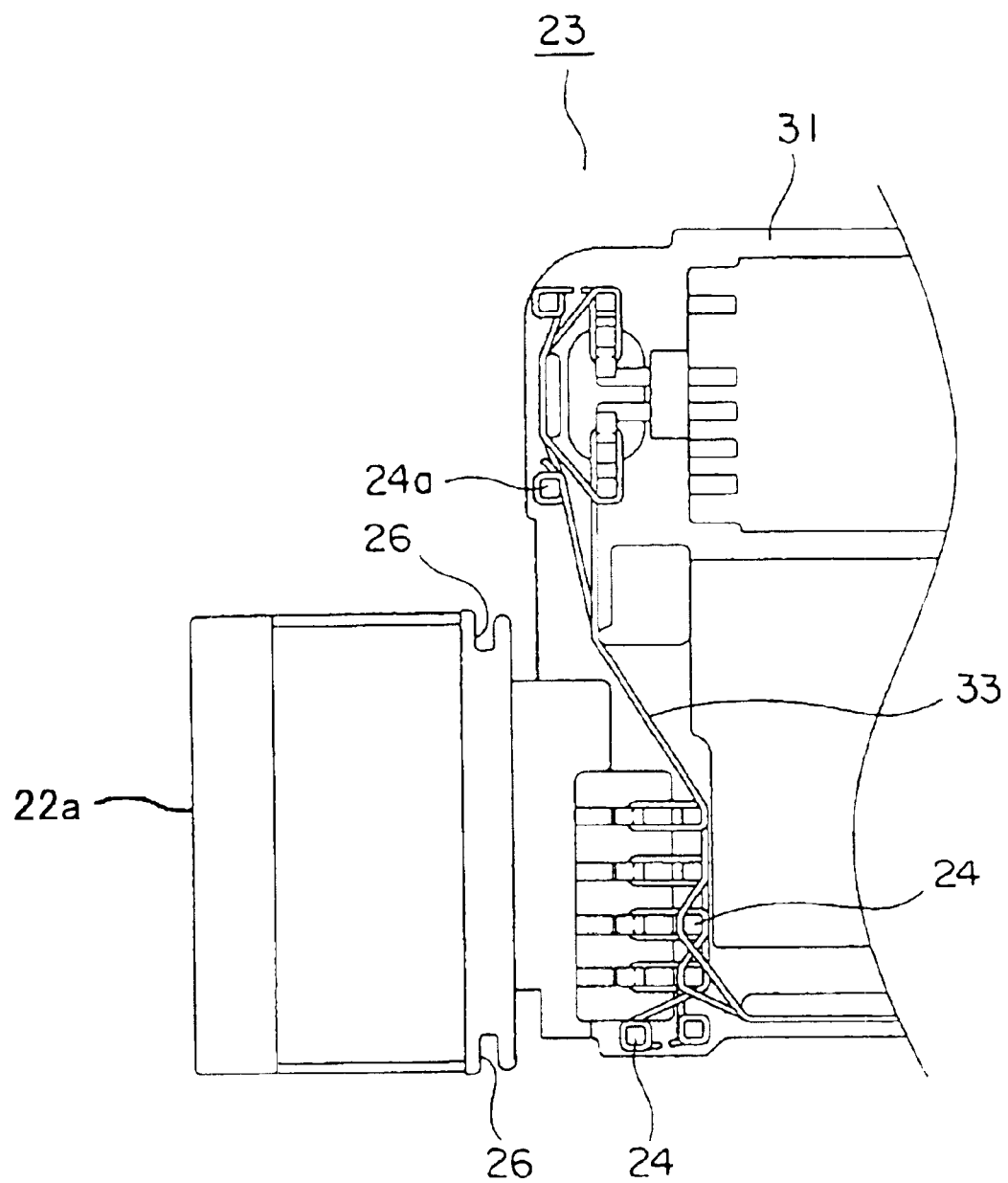
FIG. 6 is a cross sectional view of essential portions of a wiring module of an ignition apparatus for an internal combustion engine according to a second embodiment of the present invention.

FIG. 6 is a plan view of essential portions of a wiring module 30 in an ignition apparatus for an internal combustion engine according to a second embodiment of the present invention.

Figure 7:
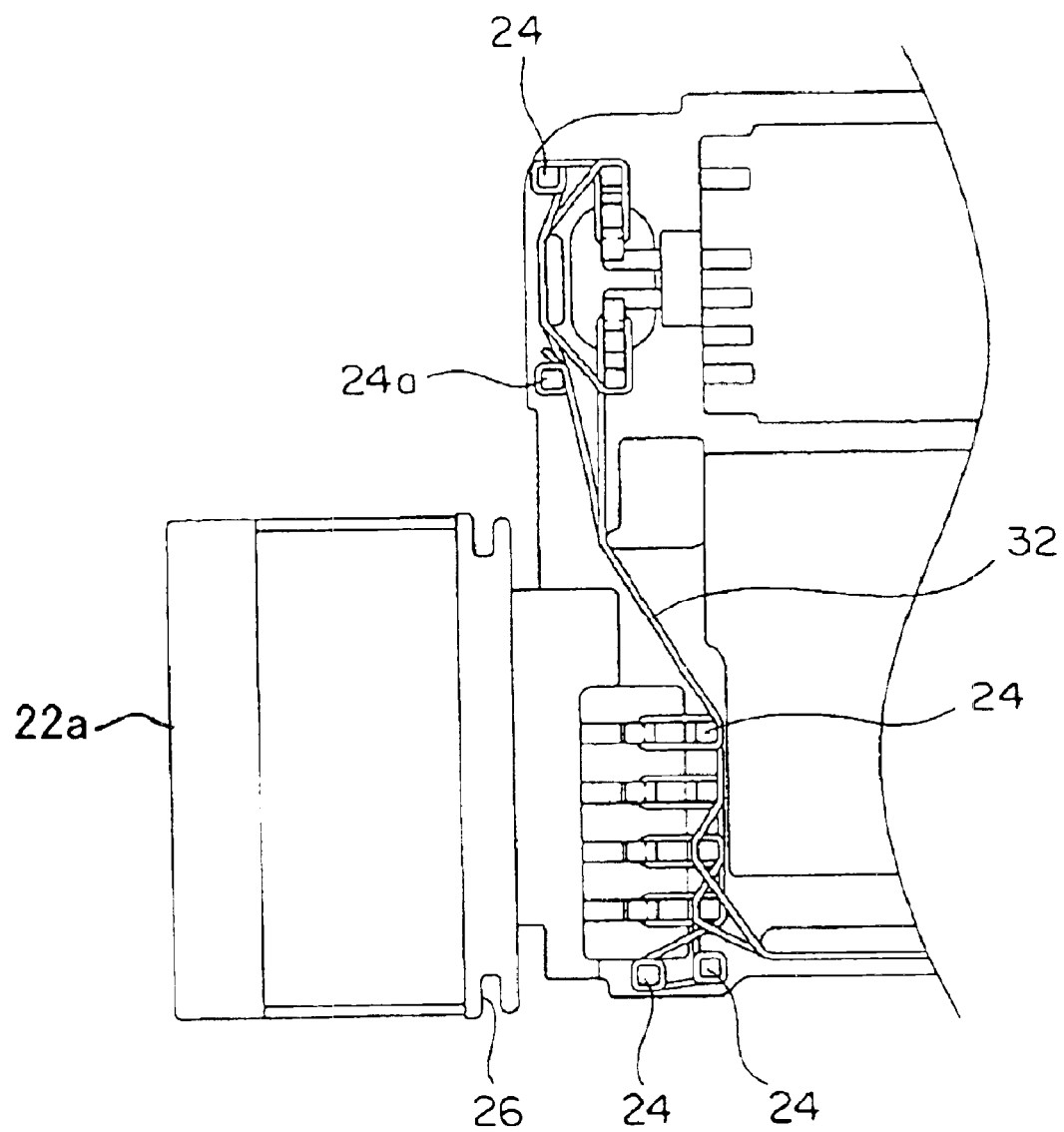
FIG. 7 is a plan view of essential portions of the wiring module of FIG. 6 illustrating the state in which a piece of electroconductive wire proper is assembled to a main body of the wiring module.
Figure 8:
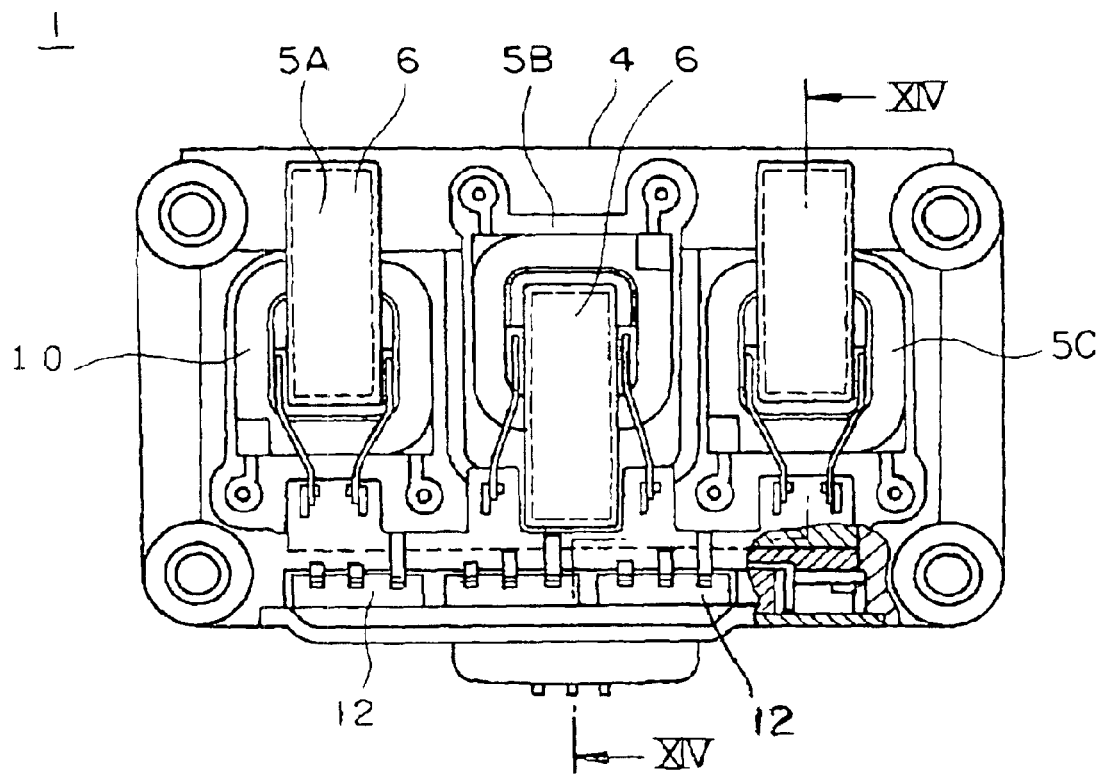
FIG. 8 is a plan view of a known ignition apparatus for an internal combustion engine shown in Japanese Patent Application Laid-Open No. Hei 7-29751.
Figure 9:
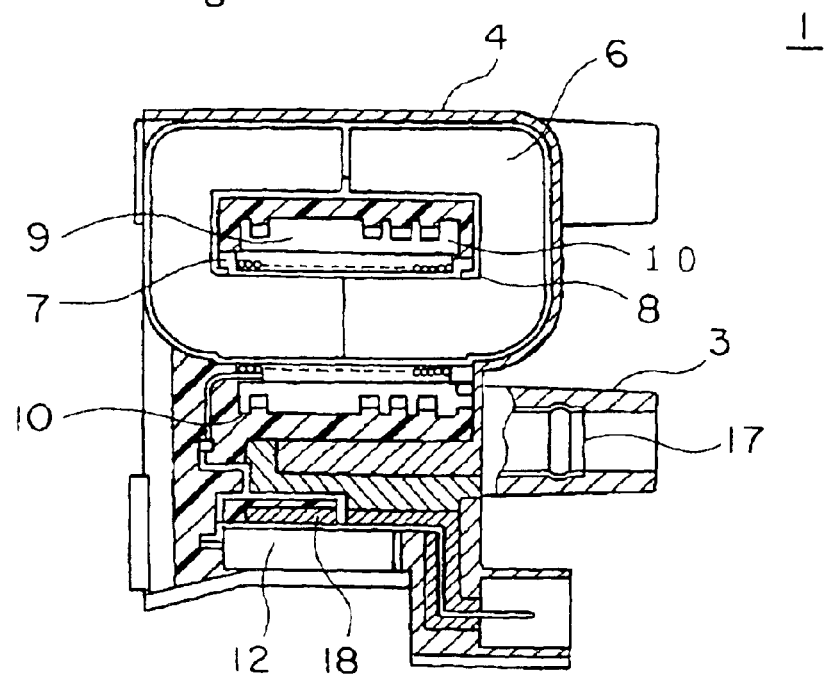
FIG. 9 is a cross sectional view of the ignition apparatus for an internal combustion engine taken along line XIV—XIV in FIG. 8.

In this embodiment, as shown in FIG. 7, one piece of flexible electroconductive wire proper or element 32 is assembled to a module main body 31 by first temporarily tacking one end of the electroconductive wire element 32 to a temporal tacking portion 24a, then further tacking the intermediate portion of the electroconductive wire element 32 to other temporal tacking portions 24, engaging it with the engagement ribs 25, and finally tacking the other end of the electroconductive wire element 32 to a temporal tacking portion 24. Thereafter, a plurality of electroconductive wires 33 are formed by cutting the electroconductive wire element 32 in an appropriate manner.

The construction of this second embodiment other than the above is similar to that of the first embodiment.

By assembling the plurality of electroconductive wires 33 to the module main body 31 in this manner, the assemblability or assembling operation of the electroconductive wires 33 can be improved as compared with the first embodiment in which the plurality of electroconductive wires 21 are individually assembled to the module main body 22.

Although in the above-mentioned first or second embodiment, the electroconductive wires 21 or 33 have been used for connecting the control unit and the switching module 12, such electroconductive wires can of course be applied to the first conductor 13, the second conductor 14 and the third conductor 15.

In addition, although in the above embodiments, the switching module 12 has been used as a circuit unit, other elements such as, for instance, an ionic current detection unit, may instead be employed.

Moreover, although the ignition apparatus for an internal combustion engine according to the first or second embodiment is an ignition apparatus for an internal combustion engine in a simultaneously firing ignition system, the present invention can also be applied to an ignition apparatus for an internal combustion engine in an independently firing ignition system.

Further, the present invention can of course be applied to an ignition apparatus for an internal combustion engine with two or more transformers.

As described above, the present invention provides the following excellent advantages.

According to one aspect of the present invention, there is provided an ignition apparatus for an internal combustion engine comprising: a casing; a transformer built in the casing and having a core, a primary coil and a secondary coil arranged to surround the core such that a high voltage for ignition is generated in the secondary coil; a circuit unit including electronic parts built into the casing; a wiring module that electrically connects the transformer and the circuit unit with each other; and an insulating resin part that fixedly attaches the transformer, the circuit unit and the wiring module to the casing. The wiring module includes a module main body having a plurality of conductors integrated with one another through a resin, and flexible electroconductive wires disposed along a surface of the module main body. With the above arrangement, the degree of freedom of the wiring paths of the electroconductive wires increases, and the wiring module can be simplified and reduced in size. As a result, it becomes possible to easily install the wiring module in the limited engine room of a vehicle. In addition, the thermal stresses imparted to the electroconductive wires, which are generated by a difference in the thermal expansion coefficients between the insulating resin portion and the electroconductive wires under thermal shock, are reduced by the module main body.

In a preferred form of the present invention, each of the electroconductive wires has an insulation coating formed on its outer surface. Thus, the electrical insulation of the electroconductive wires can be ensured even if the electroconductive wires are in contact with each other, so it is possible to arrange the electroconductive wires in such a manner that some portions thereof are superposed or overlapped one another, thus making it possible to reduce the size of the wiring module.

In another preferred form of the present invention, the insulation coating comprises an enamel coating. Thus, the electroconductive wires are also excellent in flexibility, and hence the assembling operation of the electroconductive wires on the module main body can be carried out in an easy and simple manner.

In a further preferred form of the present invention, the electroconductive wires are made of the same material as that of a conducting wire of the primary coil. Thus, the electroconductive wires are also excellent in flexibility, and hence the assembling operation of the electroconductive wires on the module main body can be carried out in an easy and simple manner.

In a still further preferred form of the present invention, the circuit unit comprises a switching module for controlling energization of the primary coil. Thus, it is possible to reduce the size of the ignition apparatus for an internal combustion engine including the switching module.

In a yet further preferred form of the present invention, the switching module is electrically connected with a control unit that sends signals to the switching module through the electroconductive wires. Thus, the electroconductive wires are not subjected to the pressure of the resin generated upon insert molding of the module main body, whereby deformation of the electroconductive wires, which would otherwise be caused by the resin pressure, can be prevented.

In a further preferred form of the present invention, each of the electroconductive wires has its one end connected with a connector metal terminal by fusing. Thus, the insulation coatings of the electroconductive wires can be burnt out and removed upon fusing without the need of being removed beforehand, thereby making it possible to shorten the time of connecting operation.

In a further preferred form of the present invention, the module main body is formed with a restricting portion for restricting wiring paths of the electroconductive wires. Thus, it is possible to prevent the electroconductive wires from lying off the outer periphery of the module main body, and hence there is no fear that when the wiring module is arranged in the casing, the electroconductive wires might interfere with the transformer previously placed in the casing, thus making it possible to prevent deformation, breaks, etc., of the electroconductive wires during manufacturing.

In a further preferred form of the present invention, when the module main body is viewed from a direction perpendicular to the surface thereof, those portions of the wiring paths of the electroconductive wires which are overlapped each other in one direction are arranged apart from each other in another direction. With such an arrangement, it is possible to ensure insulation between mutually contacted portions, if any, of the electroconductive wires, prevent the electroconductive wires from lying off the outer periphery of the module main body, and miniaturize the wiring module.

In a further preferred form of the present invention, the module main body is formed with temporal tacking portions for temporarily tacking the electroconductive wires. Thus, the electroconductive wires when arranged on the module main body is temporarily tacked to the temporal tacking portions, thereby making the connecting operation of the electroconductive wires easy and improving the reliability of the connections thereof.

In a further preferred form of the present invention, the module main body is formed with L-shaped engagement ribs for engaging the electroconductive wires. Thus, it is possible to prevent the electroconductive wires from coming off from the module main body, thus improving the operation of assembling the wiring module to the casing.

According to another aspect of the present invention, there is provided a method for manufacturing of an ignition apparatus for an internal combustion engine, the method comprising: disposing a flexible electroconductive wire element along a surface of a module main body; and thereafter cutting the electroconductive wire element to form a plurality of electroconductive wires. Thus, the operation of assembling the electroconductive wires to the module main body is improved.

While the invention has been described in terms of preferred embodiments, those skilled in the art will recognize that the invention can be practiced with modifications within the spirit and scope of the appended claims.

What is claimed is:

1. An ignition apparatus for an internal combustion engine comprising:
   a casing;
   a transformer built in said casing and having a core;
   a primary coil and a secondary coil arranged to surround said core such that a high voltage for ignition is generated in said secondary coil;
   a circuit unit including electronic parts built into said casing;
   a wiring module that electrically connects said transformer and said circuit unit with each other; and
   an insulating resin part that fixedly attaches said transformer, said circuit unit and said wiring module to said casing;
   wherein said wiring module includes a module main body having a plurality of conductors integrated with one another through a resin, and flexible electroconductive wires disposed along a surface of said module main body.

2. The ignition apparatus for an internal combustion engine according to claim 1, wherein each of said electroconductive wires has an insulation coating disposed on its outer surface.

3. The ignition apparatus for an internal combustion engine according to claim 2, wherein said insulation coating comprises an enamel coating.

4. The ignition apparatus for an internal combustion engine according to claim 3, wherein each of said electroconductive wires has at least one end connected with a connector metal terminal by fusing.

5. The ignition apparatus for an internal combustion engine according to claim 1, wherein said electroconductive wires are made of the same material as that of a conducting wire of said primary coil.

6. The ignition apparatus for an internal combustion engine according to claim 1, wherein said circuit unit comprises a switching module for controlling energization of said primary coil.

7. The ignition apparatus for an internal combustion engine according to claim 6, wherein said switching module is electrically connected with a control unit that sends signals to said switching module through said electroconductive wires.

8. The ignition apparatus for an internal combustion engine according to claim 1, wherein said module main body is formed with a restricting portion for restricting wiring paths of said electroconductive wires.

9. The ignition apparatus for an internal combustion engine according to claim 1, wherein when said module main body is viewed from a direction perpendicular to said surface thereof, those portions of the wiring paths of said electroconductive wires which are overlapped each other in one direction are arranged apart from each other in another direction.

10. The ignition apparatus for an internal combustion engine according to claim 1, wherein said module main body is formed with temporal tacking portions for temporarily tacking said electroconductive wires.

11. The ignition apparatus for an internal combustion engine according to claim 1, wherein said module main body is formed with at plurality of L-shaped engagement ribs for engaging said electroconductive wires.

12. The ignition apparatus for an internal combustion engine according to claim 1, wherein the module main body comprises at least one pair of opposed wall portions for restricting the wiring paths of the electroconductive wires.

13. The ignition apparatus for an internal combustion engine according to claim 1, wherein the casing portion comprises a convex portion for fitting into a concave portion of the wiring module.

14. A method for manufacturing an ignition apparatus for an internal combustion engine which includes: a casing; a transformer built in said casing and having a core, a primary coil and a secondary coil arranged to surround said core such that a high voltage for ignition is generated in said secondary coil; a circuit unit including electronic parts built into said casing; a wiring module that electrically connects said transformer and said circuit unit with each other; and an insulating resin part that fixedly attaches said transformer, said circuit unit and said wiring module to said casing; wherein said wiring module includes a module main body having a plurality of conductors integrated with one another through a resin, and flexible electroconductive wires disposed along a surface of said module main body; said method comprising:

disposing an electroconductive wire element along a surface of said module main body; and cutting said electroconductive wire element to form said plurality of electroconductive wires.

15. The ignition apparatus for an internal combustion engine according to claim 1, wherein the plurality of conductors are arranged on the same plane.

* * * * *